United States Patent
Verma et al.

(10) Patent No.: US 8,836,092 B2
(45) Date of Patent: Sep. 16, 2014

(54) SEMICONDUCTOR DEVICE WITH THERMAL DISSIPATION LEAD FRAME

(71) Applicant: Freescale Semiconductor, Inc., Austin, TX (US)

(72) Inventors: Chetan Verma, Noida (IN); Piyush Kumar Mishra, Noida (IN); Cheong Chiang Ng, Cheras (MY)

(73) Assignee: FreeScale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/663,462

(22) Filed: Oct. 29, 2012

(65) Prior Publication Data

US 2014/0117521 A1    May 1, 2014

(51) Int. Cl.
*H01L 23/495*     (2006.01)
*H01L 23/34*      (2006.01)

(52) U.S. Cl.
USPC ........... 257/675; 257/666; 257/667; 257/668; 257/669; 257/670; 257/671; 257/672; 257/673; 257/674; 257/712; 257/713; 257/714; 257/715; 257/716; 257/718; 257/719; 257/720; 257/721; 257/722

(58) Field of Classification Search
None
See application file for complete search history.

(56) References Cited

U.S. PATENT DOCUMENTS

| | | | |
|---|---|---|---|
| 5,532,905 A | 7/1996 | Moore | |
| 5,796,159 A | 8/1998 | Keirse | |
| 5,905,299 A | 5/1999 | Lacap | |
| 5,929,514 A * | 7/1999 | Yalamanchili | 257/676 |
| 6,965,157 B1 | 11/2005 | Perez | |
| 6,975,513 B2 * | 12/2005 | Chen et al. | 361/719 |
| 7,554,194 B2 | 6/2009 | Kelly | |
| 8,018,051 B2 | 9/2011 | Railkar | |
| 8,021,907 B2 | 9/2011 | Pagaila | |
| 2003/0003627 A1 * | 1/2003 | Yamaguchi et al. | 438/123 |
| 2004/0046241 A1 | 3/2004 | Combs et al. | |
| 2006/0156080 A1 * | 7/2006 | Tellkamp et al. | 714/700 |
| 2012/0112332 A1 * | 5/2012 | Minamio et al. | 257/675 |

* cited by examiner

*Primary Examiner* — Steven Loke
*Assistant Examiner* — Juanita B Rhodes
(74) *Attorney, Agent, or Firm* — Charles Bergere

(57) ABSTRACT

A lead frame for assembling a semiconductor device has a die pad surrounded by lead fingers. Each of the lead fingers has a proximal end close to but spaced from an edge of the die pad and a distal end farther from the die pad. A semiconductor die is attached to a surface of the die pad. The die has die bonding pads on its upper surface that are electrically connected to the proximal ends of the lead fingers with bond wires. An encapsulation material covers the bond wires, semiconductor die and the proximal ends of the lead fingers. Prior to assembly, hot spots of the die are determined and the lead fingers closest to the hot spots are selected to project closer to the die than the other lead fingers. These longer lead fingers assist in dissipating the heat at the die hot spot.

8 Claims, 10 Drawing Sheets

SEMICONDUCTOR DEVICE WITH THERMAL DISSIPATION LEAD FRAME

BACKGROUND OF THE INVENTION

The present invention relates to semiconductor packaging and, more particularly, to a lead frame for a semiconductor device that provides thermal dissipation.

A semiconductor die is an integrated circuit formed on a semiconductor wafer, such as a silicon wafer. Such a die is typically cut from the wafer and packaged using a lead frame to form a semiconductor device. The lead frame is a metal frame, usually of copper or nickel alloy, that supports the die and provides the external electrical connections for the packaged chip. The lead frame usually includes a flag or die pad, and associated lead fingers (leads). The semiconductor die is attached to the flag and bond pads on the die are electrically connected to the lead fingers of the lead frame with bond wires. The die and bond wires are encapsulated with a protective encapsulation material to form a semiconductor device. The lead fingers either project outwardly from the encapsulation or are at least flush with the encapsulation but exposed so they can be used as terminals, allowing the semiconductor device to be electrically connected directly to other devices or to a printed circuit board (PCB).

Semiconductor devices are being manufactured with an increased functionality to package pin count (external terminal or I/O count). This is partly because of improved silicon die fabrication techniques that allow die size reductions and thus a semiconductor die can be encapsulated to a form relatively small semiconductor device. However, high density packages have greater power dissipation requirements than lower density packages. The techniques used to dissipate power, primarily in the form of heat, can be a significant cost of the package. Such techniques include: thick die pads with conductive die pad epoxies or high temperature solders for attaching a die to the die pad; dedicated leads integral with the die pad; a heat sink attached to an underside of the die pad; and enlarged electrically obsolete lead frame corner regions that provide a heat sink. All of these techniques compromise package cost or space and are not necessarily directed to thermal dissipation of heat generated at specific thermal hot spot regions of the die.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
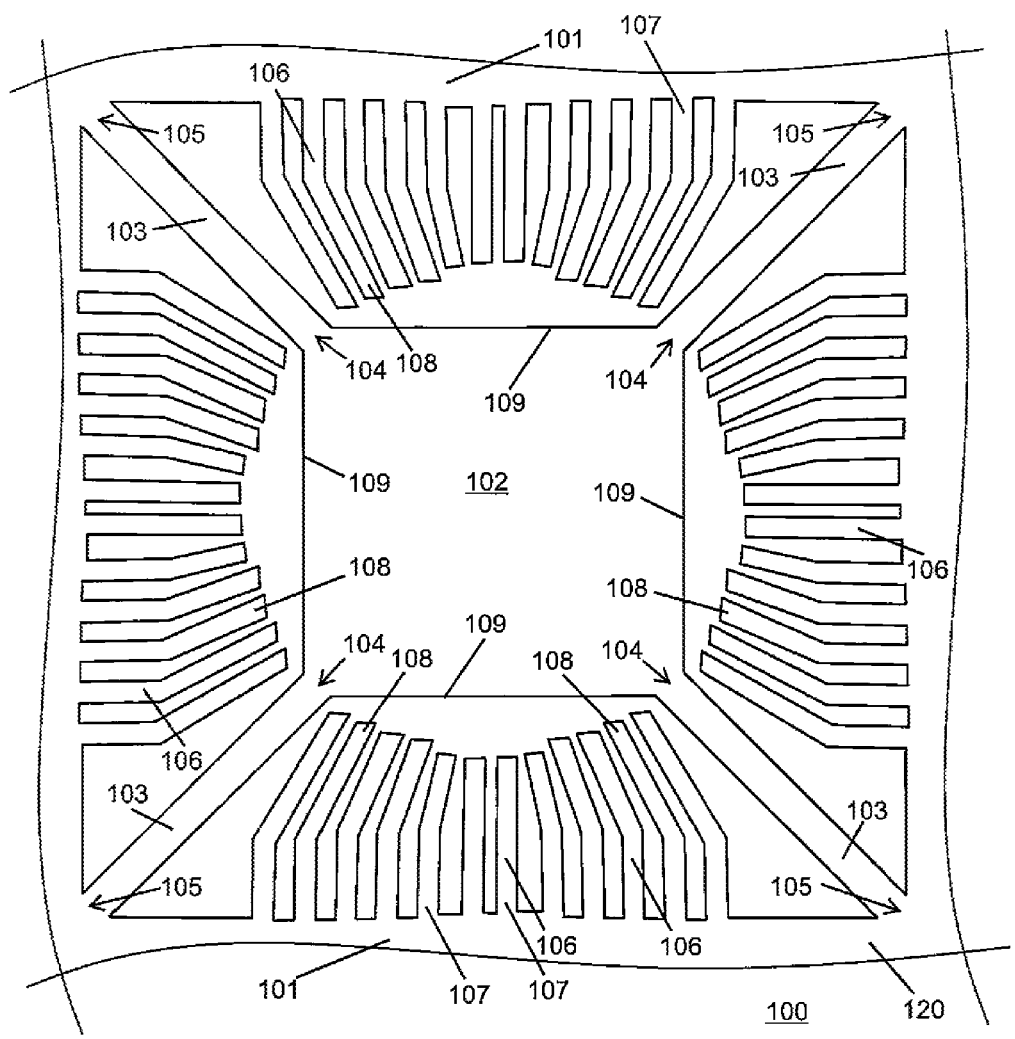
FIG. 1 is a plan view of part of a lead frame sheet comprising an electrically conductive initial lead frame structure.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, method steps and structures that comprises a list of elements does not include only those elements but may include other elements not expressly listed or inherent to such module, circuit, steps or device components. An element or step proceeded by "comprises" does not, without more constraints, preclude the existence of additional identical elements or steps that comprises the element or step.

Certain features in the drawings have been enlarged for ease of illustration and the drawings and the elements thereof are not necessarily in proper proportion. Further, the invention is shown embodied in a quad flat pack (QFP) type package. However, those of ordinary skill in the art will readily understand the details of the invention and that the invention is applicable to all leaded package types and their variations.

In one embodiment, the present invention provides for a method of designing a lead frame for use in assembling a semiconductor device. The lead frame is designed from an initial lead frame structure comprising a frame enclosing a die pad, die pad support members coupling the die pad to the frame, and a plurality of lead fingers extending from the frame towards the die pad, each of the lead fingers having a distal end at the frame and proximal end close to but spaced from an edge of the die pad. The method includes determining at least one thermal hot spot region of the die (or of the die pad when a semiconductor die is attached to it), the thermal hot spot region being determined from estimated power consumption values of regions of the semiconductor die. This thermal hot spot region may be identified as a region that has a power output per square mm of functional die surface area that is greater than a mean power output per square mm of the total functional die surface area. The method also includes modifying the initial frame structure to provide a lead frame with at least one thermal dissipating lead finger selected from the plurality of lead fingers that has a proximal end closer to the edge of the die pad than proximal ends of lead fingers adjacent to the at least one thermal dissipating lead finger. The method also performs making the lead frame, wherein the at least one thermal dissipating lead finger is the closest lead finger to the thermal hot spot region.

In another embodiment, the present invention provides for a semiconductor device including a lead frame having a die pad and a plurality of lead fingers that surround the die pad. A semiconductor die is attached to the die pad. The plurality of lead fingers are spaced from and project outwardly from the die pad. Each of the lead fingers has a proximal end close to but spaced from an edge of the die pad and a distal end farther from the die pad. Bond wires electrically couple bonding pads on the semiconductor die to respective said proximal ends of the lead fingers, and an encapsulation material covers the bond wires, semiconductor die and the proximal ends of the lead fingers. At least one thermal dissipating lead finger selected from the plurality of lead fingers has a proximal end closer to the edge of the die pad than proximal ends of lead fingers adjacent to the at least one thermal dissipating lead finger.

In a further embodiment, the present invention provides a lead frame comprising a die pad, a frame enclosing the die pad and die pad support members coupling the die pad to the frame. A plurality of lead fingers extend from the frame towards the die pad, each of the lead fingers having a distal end at the frame and a proximal end close to but spaced from an edge of the die pad. At least one thermal dissipating lead finger selected from the plurality of lead fingers has a proximal end closer to the edge of the die pad than proximal ends of lead fingers adjacent to the at least one thermal dissipating lead finger.

Referring now to FIG. 1, a plan view of part of a lead frame sheet 120 comprising an electrically conductive initial lead frame structure 100 is shown. As will be apparent to a person skilled in the art the lead frame structure 100 is one of many identical structures formed on the lead frame sheet 120 that is typically a single electrically conductive metal sheet. The initial lead frame structure 100 includes a frame 101 surrounding and enclosing a die pad 102. There are die pad support members 103 coupling the die pad 102 to the frame 101. The die pad support members 103 extend from corners 104 of the die pad 102 to corners 105 of the frame 101. There is also a plurality of lead fingers 106 extending from the frame 101 towards the die pad 102. Each of the lead fingers has a distal end 107 at the frame 101 and a proximal end 108 close to but spaced from an edge 109 of the die pad 102.

Figure 2:
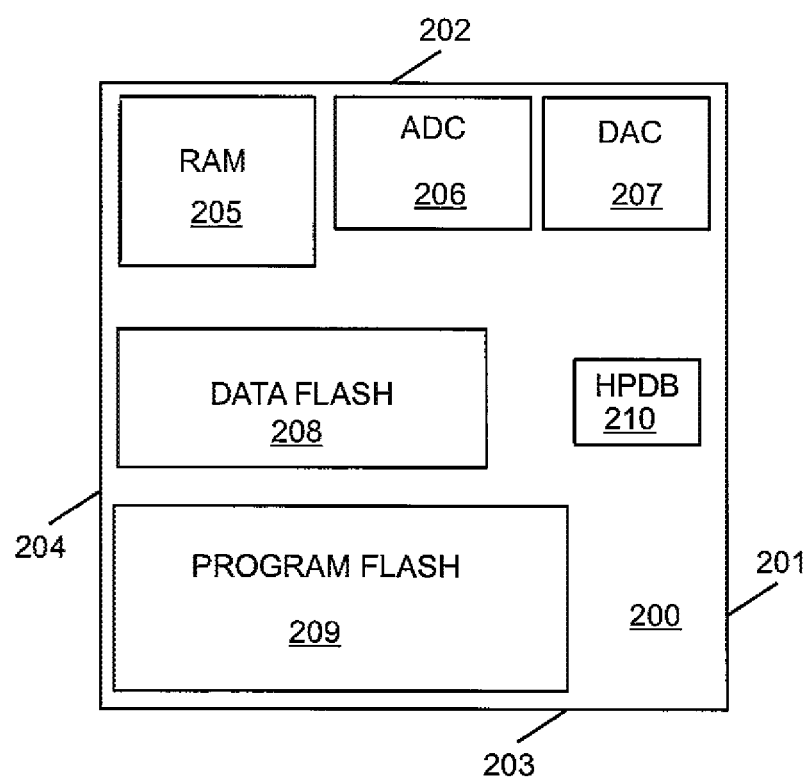
FIG. 2 illustrates a schematic block diagram of a circuit formed on a semiconductor die.

Referring to FIG. 2 there is illustrated a schematic block diagram layout of a semiconductor die 200. This layout is for illustration purposes only and includes boundary edges 201, 202, 203 and 204. The semiconductor die 200 includes a Random Access Memory (RAM) module region 205, an Analogue to Digital Converter (ADC) module region 206, a Digital to Analogue Converter (DAC) region 207, a Data Flash module region 208, a Program Flash module region 209 and a High Power Dissipation Bank (HPDB) module region 210. The High Power Dissipation Bank (HPDB) module region 210 can include, for instance, a ballast circuit or a fast switching circuit. This layout of the semiconductor die 200 essentially shows a functional semiconductor die surface area of active regions as will be apparent to a person skilled in the art. Thermal Hot spot regions of the semiconductor die 200 are determined by estimating the power consumption for each module region 205 to 210 by the following calculation:

$$P = I * V;$$

where P is the power consumption per module region; I is the estimated current consumption of the module region, V is the voltage across the module region and is typically the Drain to Source voltage difference.

If for example, the High Power Dissipation Bank (HPDB) module region 210 has an estimated power output of 300 mWatts and the total combined estimated power output for the whole semiconductor die 200 is 967 mWatts then region 210 can be considered a thermal hot spot region. More specifically, a region is considered as a thermal hot spot region if its power output per square mm of semiconductor die surface area is greater than other regions. Also, there may be more than one thermal hot spot region. Hence, as a guideline, a thermal hot spot region can be considered as a region that has a power output per square mm of functional semiconductor die surface area which is at least 10% above the mean power output per square mm of the total functional semiconductor die surface area. However, for a semiconductor die that has many small functional modules, a more suitable guideline is that a thermal hot spot region can be considered as a region that has a power output per square mm of functional semiconductor die surface area which is at least 20% above the mean power output per square mm of the total functional semiconductor die surface area. It will therefore be understood that a thermal hot spot region is a relative term and in general a thermal hot spot region will have a power output per square mm of functional semiconductor die surface area that is greater than the mean power output per square mm of the total functional semiconductor die surface area.

Once thermal hot spot regions are identified, which in this example is the High Power Dissipation Bank (HPDB) module region 210, at least some of the layout of the semiconductor die 200 can be superimposed onto the die pad 102.

Figure 3:
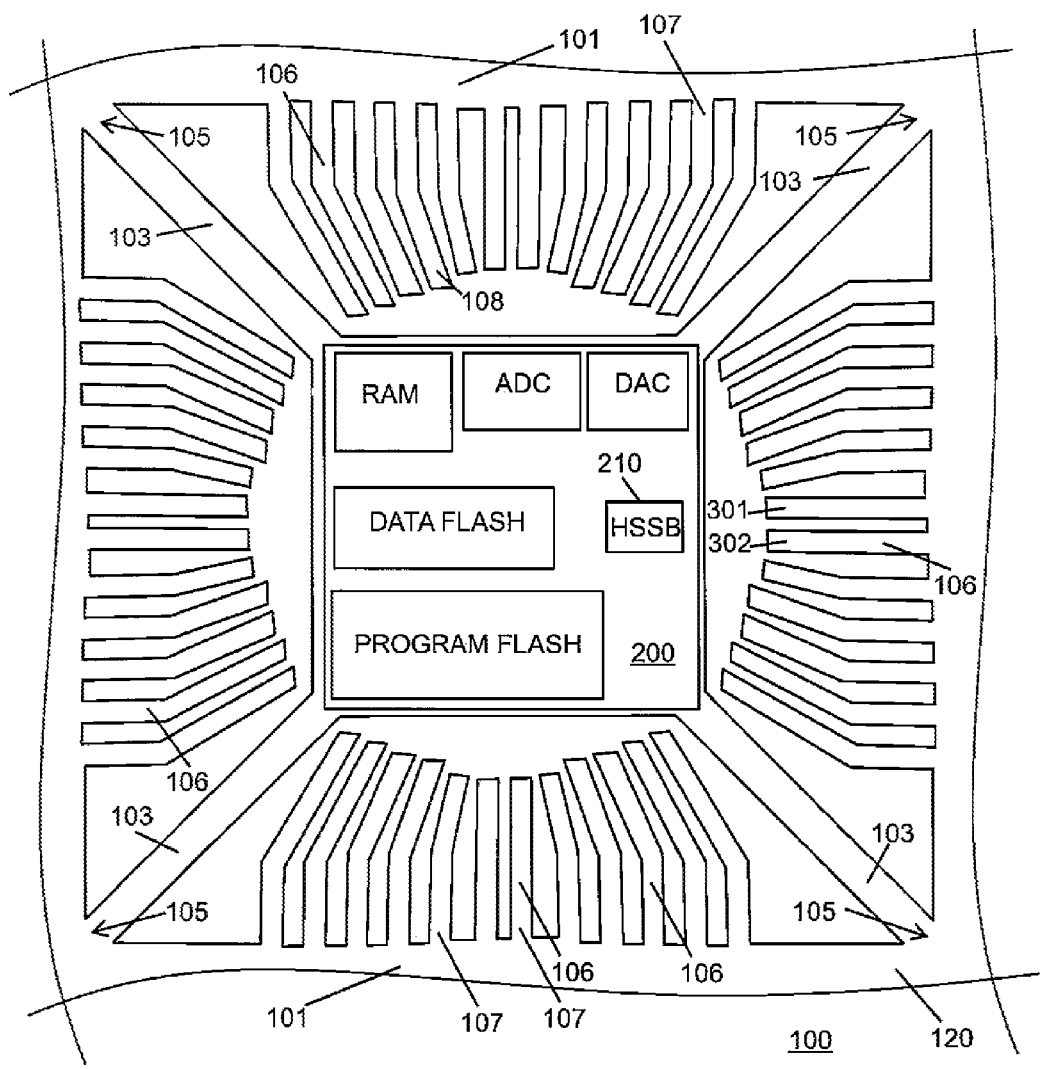
FIG. 3 illustrates the initial lead frame structure of FIG. 1 when the layout of the semiconductor die of FIG. 2 has been super-imposed onto a die pad of the initial lead frame structure in accordance with a preferred embodiment of the present invention.

FIG. 3 illustrates the initial lead frame structure 100 when all the block layout of the semiconductor die 200 has been superimposed onto the die pad 102 in accordance with a preferred embodiment of the present invention. Once the relevant module regions are superimposed onto the die pad 102 (essentially just the estimated thermal hot spot regions are required), the location of the thermal hot spot HS region(s) (region 210) relative to the lead fingers 106 are determined. In other words, a die pad thermal hot spot region identified on the die pad 102 is identified (determined) from the superimposed region 210 and the closest lead fingers 106 to this thermal hot spot region 210 are identified by reference numerals 301 and 302.

Figure 4:
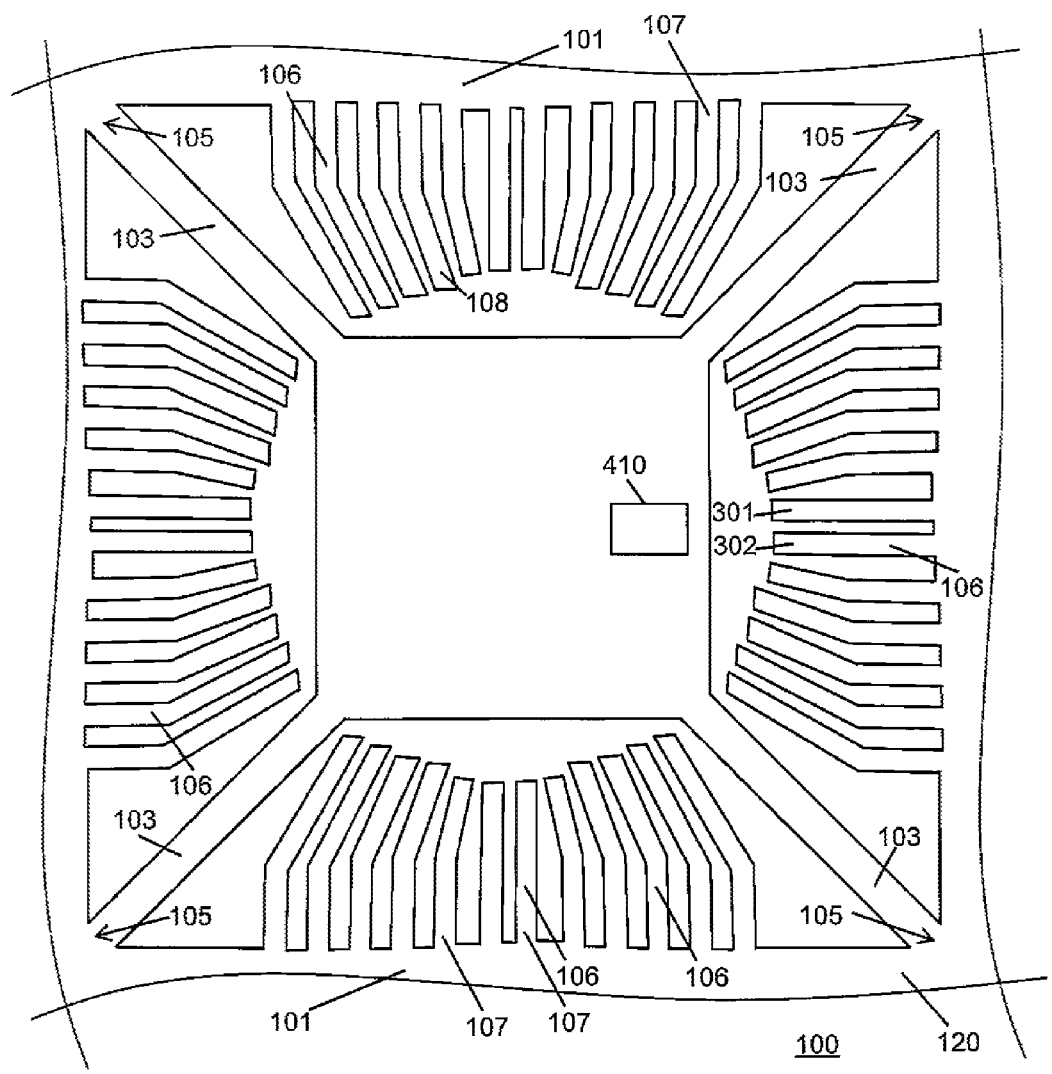
FIG. 4 illustrates the initial lead frame structure of FIG. 1 with an identified thermal hot spot region on a die pad of the initial lead frame structure, in accordance with a preferred embodiment of the present invention.

Referring to FIG. 4, there is illustrated the initial lead frame structure 100 with a die pad thermal hot spot region 410 identified on the die pad 102, in accordance with a preferred embodiment of the present invention. As mentioned above, this thermal hot spot region 410 is the region 210 superimposed on the die pad 102. As shown, the closest lead fingers 106 to this thermal hot spot region 210 are the prior mentioned fingers identified by reference numerals 301 and 302.

Figure 5:
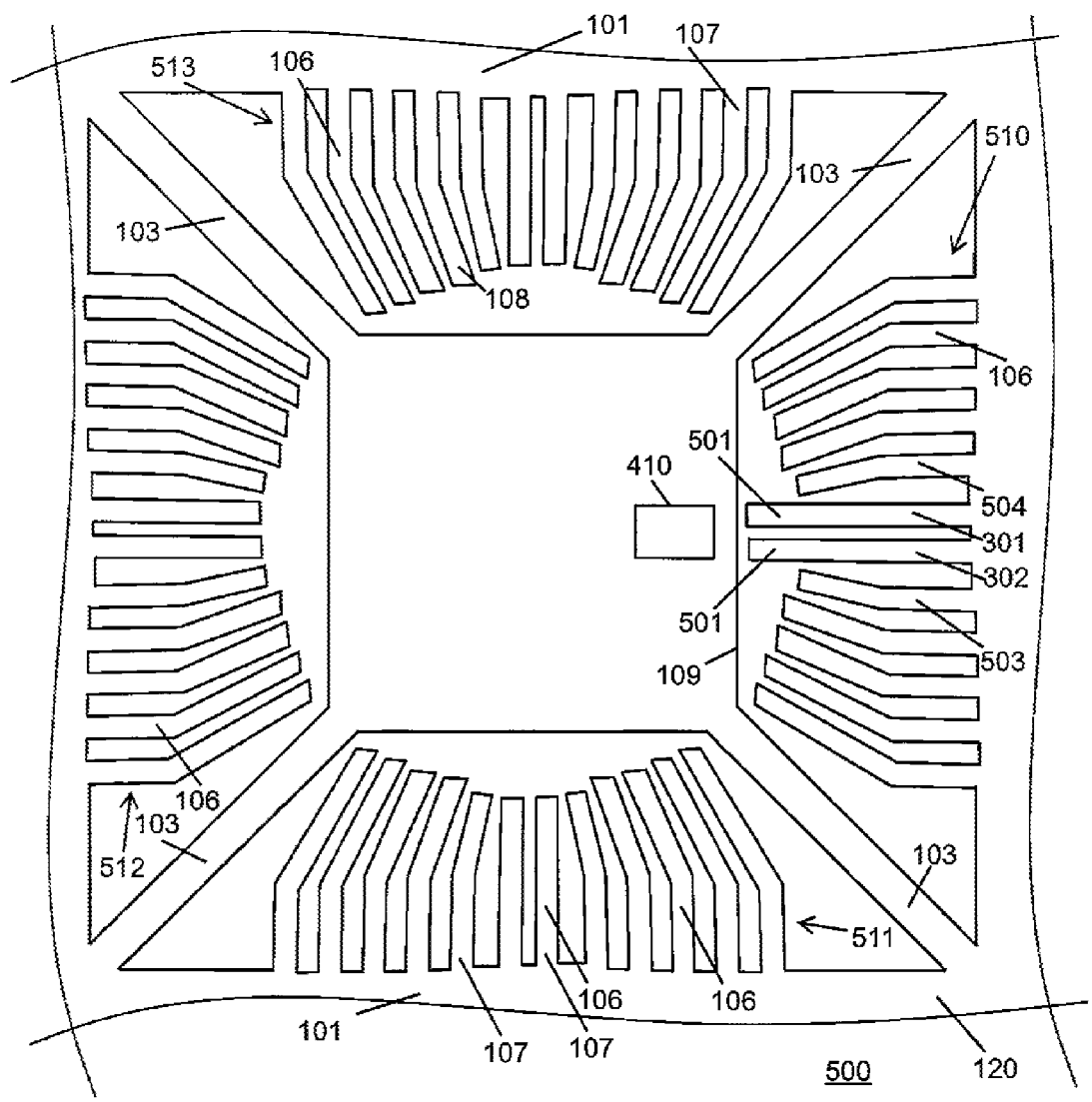
FIG. 5 illustrates a lead frame that is a modified version of the initial lead frame structure of FIG. 1 in accordance with a preferred embodiment of the present invention.

Referring to FIG. 5, there is illustrated a lead frame 500 that is a modified version of the initial lead frame structure 100, in accordance with a preferred embodiment of the present invention. The lead frame 500 has a at least one thermal dissipating lead finger 501 selected from the plurality of lead fingers 106 that have proximal ends 108 closer to the edge 109 of the die pad 102 than proximal ends 108 of lead fingers 503,504 adjacent to the thermal dissipating lead fingers 501. In this specific embodiment, there are two thermal dissipating lead fingers 501 comprising the fingers identified by reference numerals 301 and 302.

As shown, the lead fingers 106 comprise lead finger groups, 510, 511, 512, 513 disposed in gaps between the die pad support members 103, and the thermal dissipating lead fingers 501 are located away from the die pad support members 103. More specifically, in this example the thermal dissipating lead fingers 501 are centrally located between the die pad support members 103. Also, the thermal dissipating lead fingers 501 are ideally spaced from the proximal edge 109 of the die pad 102 by a minimum distance requirement as stipulated by lead frame design rules.

Figure 6:
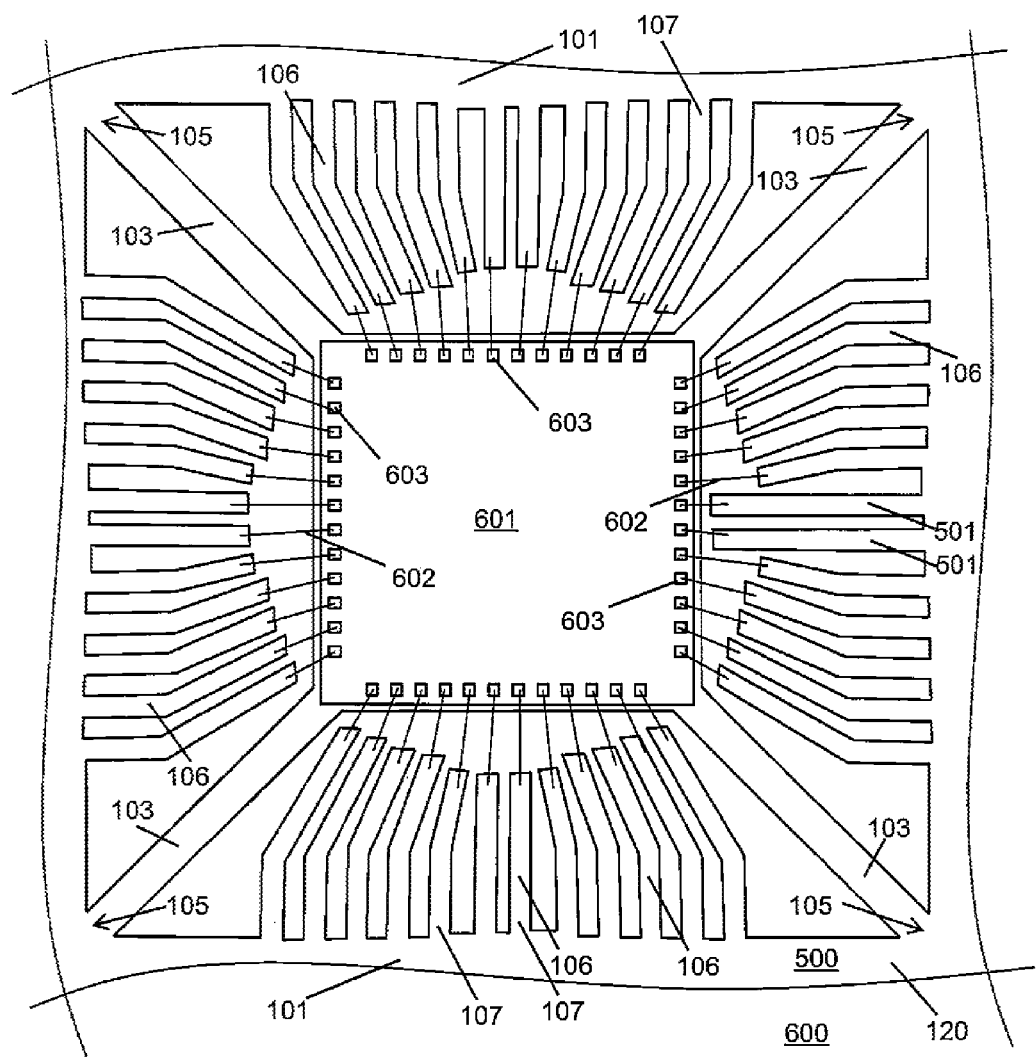
FIG. 6 illustrates a partly fabricated semiconductor package comprising the lead frame of FIG. 5, in accordance with a preferred embodiment of the present invention.

Referring to FIG. 6, there is illustrated a part fabricated semiconductor package 600 comprising the lead frame 500, in accordance with a preferred embodiment of the present invention. The part fabricated semiconductor package 600 has a semiconductor die 601 mounted to the die pad 102 by a suitable epoxy or solder. This semiconductor die 601 has the same layout as the schematic block diagram layout of the semiconductor die 200. In other words, the schematic block diagram layout of the semiconductor die 200 is the schematic block diagram layout of the semiconductor die 601 and the semiconductor die 601 is positioned on the die pad so that the High Power Dissipation Bank (HPDB) module region 210 is located as previously illustrated in FIG. 3. Thus the die pad thermal hot spot region 410 is proximal to the thermal dissipating lead fingers 501. The part fabricated semiconductor package 600 has bond wires 602 electrically coupling bonding pads 303 on the semiconductor die 601 to respective proximal ends 108 of the lead fingers 106.

Figure 7:
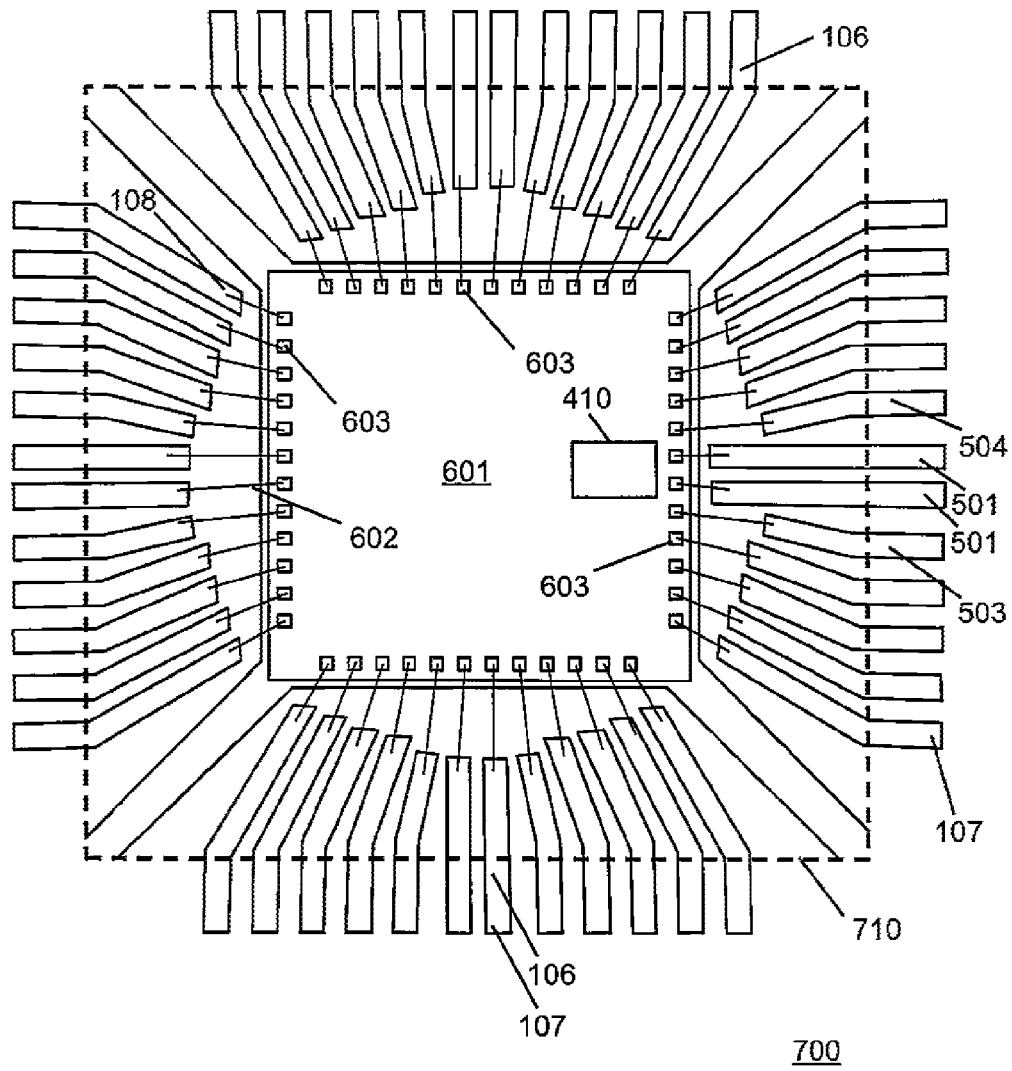
FIG. 7 illustrates a semiconductor package comprising the partly fabricated semiconductor package of FIG. 6, in accordance with a preferred embodiment of the present invention.

Referring to FIG. 7, there is illustrated a semiconductor package 700 comprising the part fabricated semiconductor package 600, in accordance with a preferred embodiment of the present invention. The semiconductor package 700 has been separated (singulated) from the frame 101 of the lead frame 500 by cutting or punching. The lead fingers 106 have also been trimmed and formed as required as will be apparent to a person skilled in the art. Also, there is an encapsulation material 710 (shown in phantom) covering the bond wires 602, semiconductor die 601 and the proximal ends 108 of all the lead fingers 106. The encapsulation material 710 is a molding compound that is injection molded to the lead frame 500.

As shown, the lead fingers 106 are spaced from and project outwardly from the die pad 102 and each of the lead fingers 106 has a proximal end 108 close to but spaced from an edge of the die pad and a distal end 107 farther from the die pad 102. The distal ends 107 are formed (bent) to form a seating plane for the semiconductor package 700 and provide for electrical connection to pads of a circuit board. Furthermore, the thermal dissipating lead fingers 501 selected from the lead fingers 106 have proximal ends 108 closer to the edge of the die pad 102 than proximal ends 102 of lead fingers 503,504 adjacent to the thermal dissipating lead fingers 501. Thus, each lead finger 301 comprising thermal dissipating lead fingers 501 provides a lower die to board thermal resistance than the lead fingers 106 that are adjacent to the thermal dissipating lead fingers 501. These thermal dissipating lead fingers 501 are the closest lead fingers to a thermal hot spot region of the semiconductor die 601 which is region 401 (the location of the High Power Dissipation Bank (HPDB) module region 210).

Figure 8:
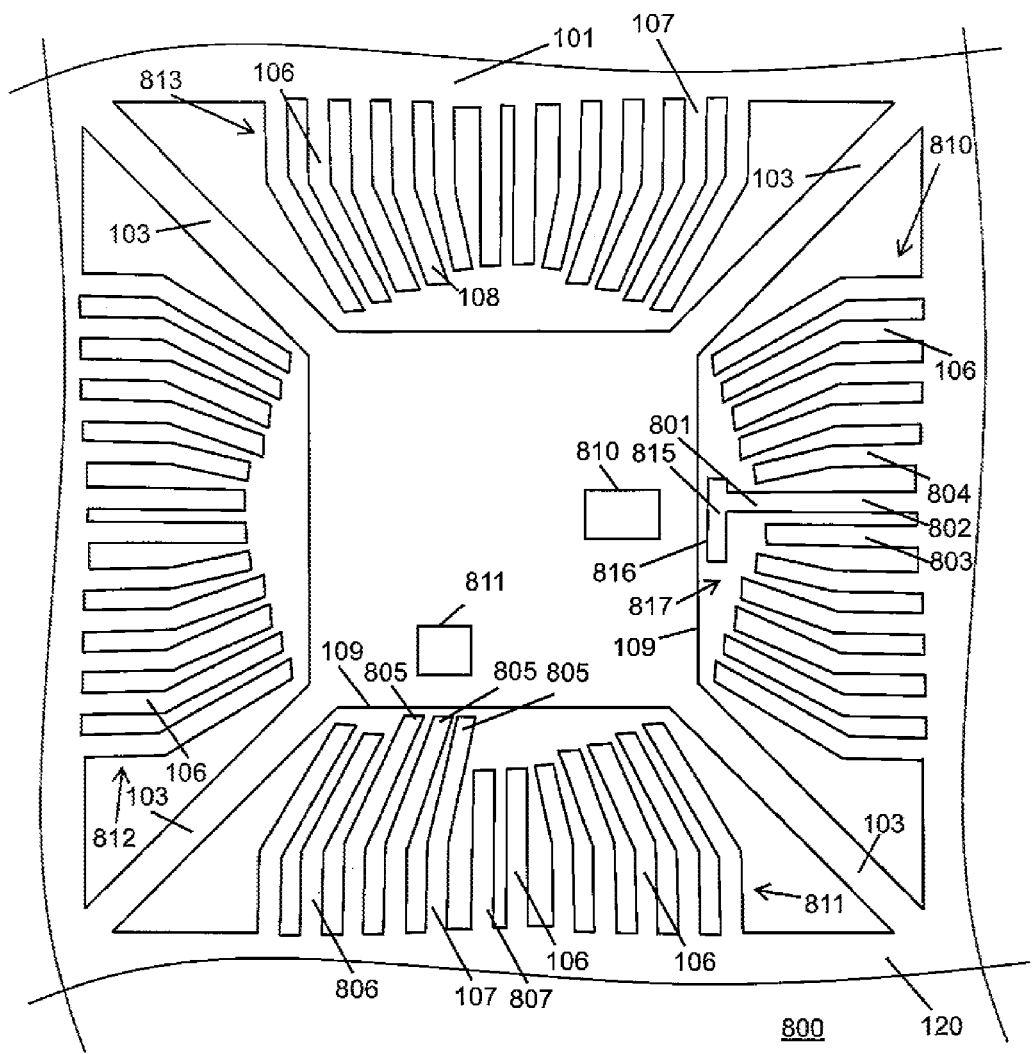
FIG. 8 illustrates a lead frame that is a modified version of the initial lead frame structure of FIG. 1, in accordance with another preferred embodiment of the present invention.

Referring to FIG. 8, there is illustrated a lead frame 800 that is a modified version of the initial lead frame structure 100, in accordance with another preferred embodiment of the present invention. The lead frame 800 has at least one first thermal dissipating lead finger 801 selected from the plurality of lead fingers 106 that have proximal ends 108 closer to the edge 109 of the die pad 102 than proximal ends 108 of lead fingers 803,804 adjacent to the thermal dissipating lead fingers 801. In this specific embodiment, the least one first thermal dissipating lead finger 801 is a single lead finger 802. This single lead finger 802 is closest to an identified thermal hot spot region 810 as determined in an identical or similar manner to that described above. The single lead finger 802 has a lateral projection 815 extending from its proximal end, and in this embodiment the lateral projection has an edge 816 parallel to a closest edge 109 of the die pad 102. This lateral projection 815 is extends laterally relative to a longitudinal axis of the single lead finger 802 and extends in a gap 817 between the edge 109 of the die pad 102 and at least one of the lead fingers 106.

There also an at least one second thermal dissipating lead finger 805 selected from the plurality of lead fingers 106 that have proximal ends 108 closer to the edge 109 of the die pad 102 than proximal ends 108 of lead fingers 806,807 adjacent to the thermal dissipating lead finger 805. Again, the thermal dissipating lead fingers 805 are closest to an identified thermal hot spot region 811 as determined in an identical or similar manner to that described above.

As shown, the lead fingers 106 comprise lead finger groups, 810, 811, 812, 813 disposed in gaps between the die pad support members 103, and the thermal dissipating lead finger 801 is located away from the die pad support members 103. More specifically, in this example the thermal dissipating lead finger 801 is centrally located between the die pad support members 103, whereas the thermal dissipating lead fingers 805 are not centrally located between the die pad support members 103. Also, the thermal dissipating lead fingers 801, 805 are ideally spaced from respective proximal edges 109 of the die pad 102 by a minimum allowable distance requirement as stipulated by lead frame design rules as will be apparent to a person skilled in the art.

Figure 9:
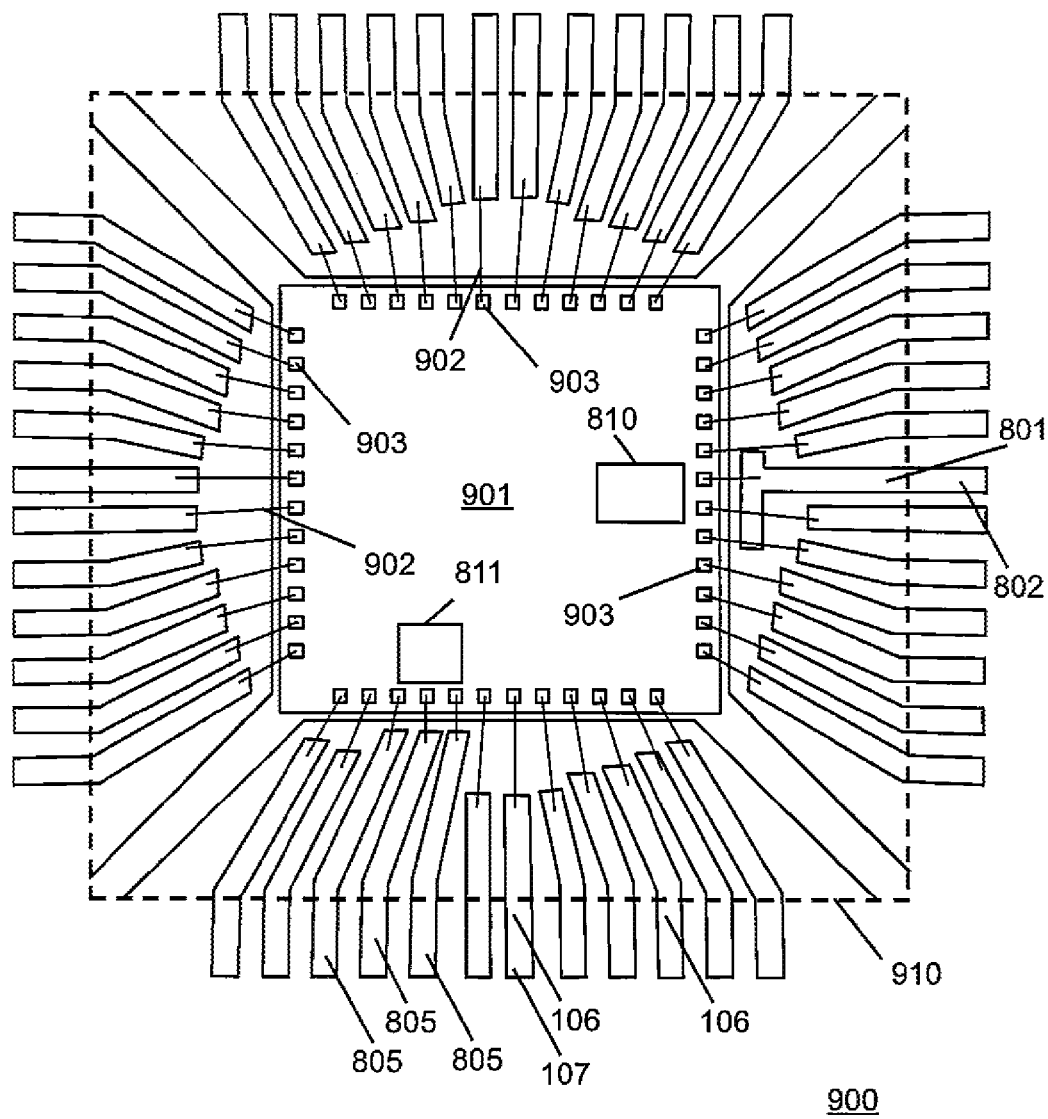
FIG. 9 illustrates a semiconductor device comprising the lead frame of FIG. 8, in accordance with another preferred embodiment of the present invention.

Referring to FIG. 9, there is illustrated a semiconductor package 900 comprising the lead frame 800, in accordance with another preferred embodiment of the present invention. The semiconductor package 900 has a semiconductor die 901 mounted to the die pad 102 by a suitable epoxy or solder. This semiconductor die 901 has the same layout as the schematic block diagram layout of the semiconductor die 200. In other words, the schematic block diagram layout of the semiconductor die 200 is the schematic block diagram layout of the semiconductor die 901 and is positioned so that the High Power Dissipation Bank (HPDB) module region 210 is located as previously illustrated in FIG. 3. The part fabricated semiconductor package 900 has bond wires 902 electrically coupling bonding pads 903 on the semiconductor die 901 to respective proximal ends 108 of the lead fingers 106.

The semiconductor package 900 has been separated (singulated) from the frame 101 of the lead frame 800 by cutting or punching. The lead fingers 106 have also been trimmed and formed as required as will be apparent to a person skilled in the art. Also, there is an encapsulation material 910 (shown in phantom) covering the bond wires 902, semiconductor die 901 and the proximal ends 108 of all the lead fingers 106. The encapsulation material 910 is a molding compound that is injection molded to the lead frame 800.

As shown, the lead fingers 106 are spaced from and project outwardly from the die pad 102 and each of the lead fingers 106 has a proximal end 108 close to but spaced from an edge of the die pad 102 and a distal end 107 farther from the die pad 102. The distal ends 107 are formed (bent) to form a seating plane for the semiconductor package 900 and provide for electrical connection to pads of a circuit board. Furthermore, both the first and second thermal dissipating lead fingers 801, 805 have proximal ends 108 closer to the edge of the die pad 102 than proximal ends 102 of lead fingers 803,804 and 806,807. Thus, each lead of the thermal dissipating lead finger lead fingers 801, 805 provides a lower die to board thermal resistance than the lead fingers 106 that are adjacent to either of these thermal dissipating lead fingers 801, 805. Also, these thermal dissipating lead fingers 801, 805 are the closest lead fingers to their respective thermal hot spot regions 810, 811.

Figure 10:
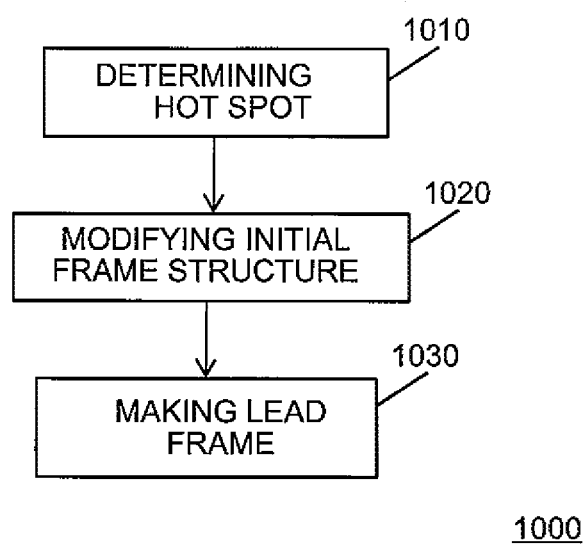
FIG. 10 is a flow chart illustrating a method designing a lead frame for a semiconductor device in accordance with another preferred embodiment of the present invention.

Referring to FIG. 10, a flow chart of a method 1000 of designing a lead frame for a semiconductor die package in accordance with another preferred embodiment of the present invention is shown. The lead frame is designed from a lead frame structure such as the initial lead frame structure 100 which can be an actual or computer generated representation of such a structure. By way of example, the lead frame structure can be considered to be the initial lead frame structure 100.

The method 1000 at a determining bock 1010 performs a process of determining at least one thermal hot spot region of the die pad 102 of when a semiconductor die is attached to the die pad. The thermal hot spot region is determined from estimated power consumption values of regions of the semiconductor die as described above. Next, at a modifying block 1020, the method 1000 performs a process of modifying the initial frame structure to provide a lead frame with at least one thermal dissipating lead finger selected from the plurality of lead fingers. By way of example the lead frame can be considered to be the lead frame 500 and the at least one thermal dissipating lead finger 501 has a proximal end closer to the edge of the die pad 102 than proximal ends of lead fingers 106 adjacent to the at least one thermal dissipating lead finger 501. The method 1000, at a making block 1030, then provides for making the lead frame 500 such that the at least one thermal dissipating lead finger 501 are the closest lead finger to the thermal hot spot region.

Advantageously, the present invention potentially reduces or alleviates the need for relatively expensive power dissipation techniques for some semiconductor packages. The present invention also provides for thermal dissipation of hot spot regions whilst keeping most of the lead fingers 106 at a suitable distance from the die pad 102 to provide a finger to die pad gap. This finger to die pad gap is sufficiently large to allow the encapsulation material 710 or 910 to be injection molded between most or all of the lead fingers 106 and the die pad 102 which improves the structural integrity and reliability semiconductor packages made from the lead frames made in accordance with the present invention.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:
1. A semiconductor device, comprising:
a die pad;
a semiconductor die attached to the die pad;
a plurality of lead fingers spaced from and projecting outwardly from the die pad, each of the lead fingers having a proximal end close to but spaced from an edge of the die pad and a distal end farther from the die pad;
bond wires electrically coupling bonding pads on a surface of the semiconductor die to respective proximal ends of the lead fingers; and
an encapsulation material covering the bond wires, semiconductor die and the proximal ends of the lead fingers,
wherein at least one thermal dissipating lead finger selected from the plurality of lead fingers has a proximal end closer to the edge of the die pad than proximal ends of lead fingers that are not selected as the at least one thermal dissipating lead finger and wherein the at least one thermal dissipating lead finger is the closest lead finger to a thermal hot spot region of the semiconductor die, wherein the at least one thermal dissipating lead finger includes two or more lead fingers that are the closest lead fingers to the thermal hot spot region of the semiconductor die.

2. The semiconductor device of claim 1, wherein each thermal dissipating lead finger provides a lower die to board thermal resistance than the lead fingers that are adjacent to the at least one thermal dissipating lead finger.

3. A lead frame for use in assembling a semiconductor device, the lead frame comprising:
a die pad for supporting a semiconductor die;
a frame surrounding the die pad;
die pad support members coupling the die pad to the frame; and
a plurality of lead fingers extending from the frame towards the die pad, each of the lead fingers having a distal end at the frame and a proximal end close to but spaced from an edge of the die pad,
wherein at least one thermal dissipating lead finger selected from the plurality of lead fingers has a proximal end closer to the edge of the die pad than proximal ends of lead fingers that are not selected as the at least one thermal dissipating lead finger, and wherein the at least one thermal dissipating lead finger is the closest lead finger to a thermal hot spot region of a semiconductor die to be attached to the die pad.

4. The lead frame of claim 3, wherein that at least one thermal dissipating lead finger is a single lead finger.

5. The lead frame of claim 4, wherein the single lead finger has a lateral projection extending from its proximal end.

6. The lead frame of claim 5, wherein the lateral projection extends in a gap between a closest edge of the die pad and at least one of the plurality of lead fingers.

7. The lead frame of claim 3, wherein the plurality of lead fingers comprise die pad edge lead finger groups disposed between the die pad support members, and wherein the at least one thermal dissipating lead finger is located away from the die pad support members.

8. The lead frame of claim 7, wherein the at least one thermal dissipating lead finger is centrally located between the die pad support members.

* * * * *